United States Patent [19]

Hughes

[11] 4,393,430
[45] Jul. 12, 1983

[54] MULTI-PHASE FAILURE DETECTOR

[76] Inventor: Jack H. Hughes, 4812 Lone Hill Rd., Chattanooga, Tenn. 37416

[21] Appl. No.: 271,190

[22] Filed: Jun. 8, 1981

[51] Int. Cl.³ .............................................. H02H 3/24
[52] U.S. Cl. ....................................... 361/92; 361/85; 361/62
[58] Field of Search ...................... 361/92, 85, 87, 62, 361/63

[56] References Cited

U.S. PATENT DOCUMENTS 3,313,984  4/1967  Hupp ...................................... 361/92
3,343,038  9/1967  Johnson ............................. 361/85 X
3,636,541  1/1972  Genuit et al. ..................... 361/92 X Primary Examiner—Reinhard J. Eisenzopf
Attorney, Agent, or Firm—Harvey B. Jacobson

[57] ABSTRACT

Phase line currents of a polyphase power supply are rectified and applied to a common input terminal of a sine wave detector circuit to sense the presence of a signal current that is injected from a low voltage DC source into any time gaps that are formed between phase currents only when one or more phase line failures occur. Failure of the DC source disables the detector circuit.

11 Claims, 3 Drawing Figures

MULTI-PHASE FAILURE DETECTOR

MULTI-PHASE FAILURE DETECTOR

BACKGROUND OF THE INVENTION

This invention relates to the protection of electrical loads from damage caused by phase line failure in a polyphase power supply to which the load is connected.

Polyphase power system failure detectors for protecting electrical loads, are of course well known. Such power failure detectors often sense one or more failure conditions including phase unbalance, reduction in voltage level and often require a predetermined sequence of connections to the power phase lines for proper operation. Sometimes, such power failure detectors are limited to a predetermined power cycle frequency. In responding to voltage drop or current unbalance as the sensed conditions of power failure, prior power failure detectors are sometimes triggered into operation unintentionally as a result of momentary or transient conditions of little concern.

It is therefore an important object of the present invention to provide a power failure detector which is less likely to unintentionally respond to transient conditions and which is more versatile in use for protecting equipment powered at different voltage levels and different cycle frequencies.

SUMMARY OF THE INVENTION

In accordance with the present invention, a polyphase power failure detector is provided wherein direct electrical connections are made in any desired sequence to the power phase lines of the power supply from a rectifier and current limiting section which thereby supplies a sine wave sensing circuit with a combined input signal formed by negative rectified phase currents having an overlapping wave form configuration. In the event of any phase line failure, a short time gap between rectified phase currents occurs. A low DC voltage source is provided and arranged to inject a DC signal current into the time gap when it occurs. The injected DC current is sensed by the sine wave sensing circuit to provide a signal output which energizes a relay through which an alarm indicator is operated and brake device engaged in order to stop equipment from operating in order to prevent damage. Power failure of the low voltage DC source is detected by another relay in order to disable operation of the sensing circuit and to also cause engagement of the brake device for protection of the associated equipment. When power is restored, the relay automatically resets the detector circuit.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF DRAWING FIGURES

DETAILED DESCRIPTION OF PREFERRED EMBODIMENT

Figure 1:
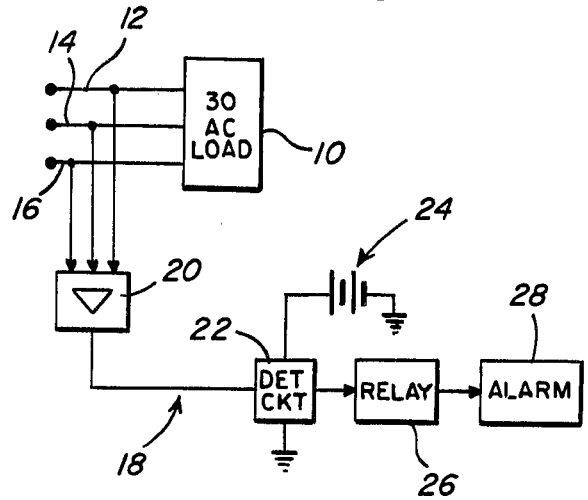
FIG. 1 is a schematic block diagram illustrating the power phase failure protection system of the present invention.

Referring now to the drawings in detail, FIG. 1 schematically illustrates a three phase electrical load 10 to which electrical power is supplied from a three phase AC voltage source through power phase lines 12, 14 and 16. The load 10, such as an electric motor, is protected against phase failure by the protection system of the present invention generally referred to by reference numeral 18. The system 18 includes a rectifier and current limiting section 20 connecting the power phase lines to a sine wave sensing circuit 22 adapted to be powered by a DC source 24. The sensing circuit is connected by a relay section 26 to an alarm device 28.

Figure 3:
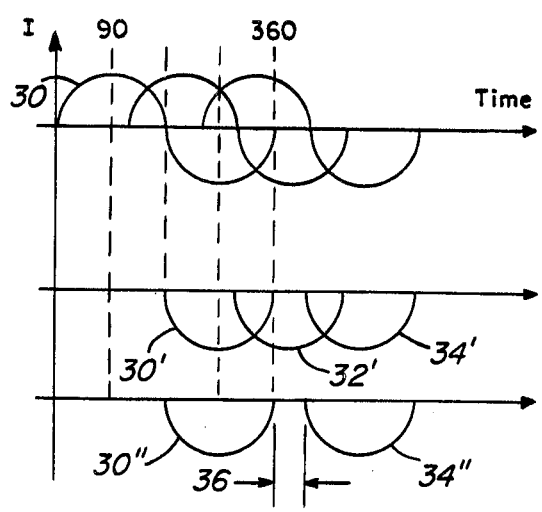
FIG. 3 is a graphical illustration of the current characteristics associated with the detector system of FIGS. 1 and 2.

FIG. 3 illustrates a typical set of balanced three phase sinusoidal wave forms 30, 32 and 34 representing the phase currents in power phase lines 12, 14 and 16 connected to the AC load 10. The rectifier and current limiting section 20 is operative to rectify the phase currents and supply negative rectified output currents denoted in FIG. 3 by reference numerals 30', 32' and 34'. These rectified currents are fed to the detector circuit 22, which under normal conditions produces no signal output. Should there be any failure in any of the power phases, such as loss of the phase current 32, a negative rectified output of circuit section 20 would be characterized by negative phase currents 30" and 34" spaced by a time gap 36 as depicted in FIG. 3. The duration of the time gap is an inverse function of the frequency of the AC power supply. For a 60 cycle power supply, for example, the time gap is approximately 0.004 seconds. The phase failure condition will be sensed by the detector circuit 22 in accordance with the present invention to produce an output as will be explained hereinafter in detail.

Figure 2:
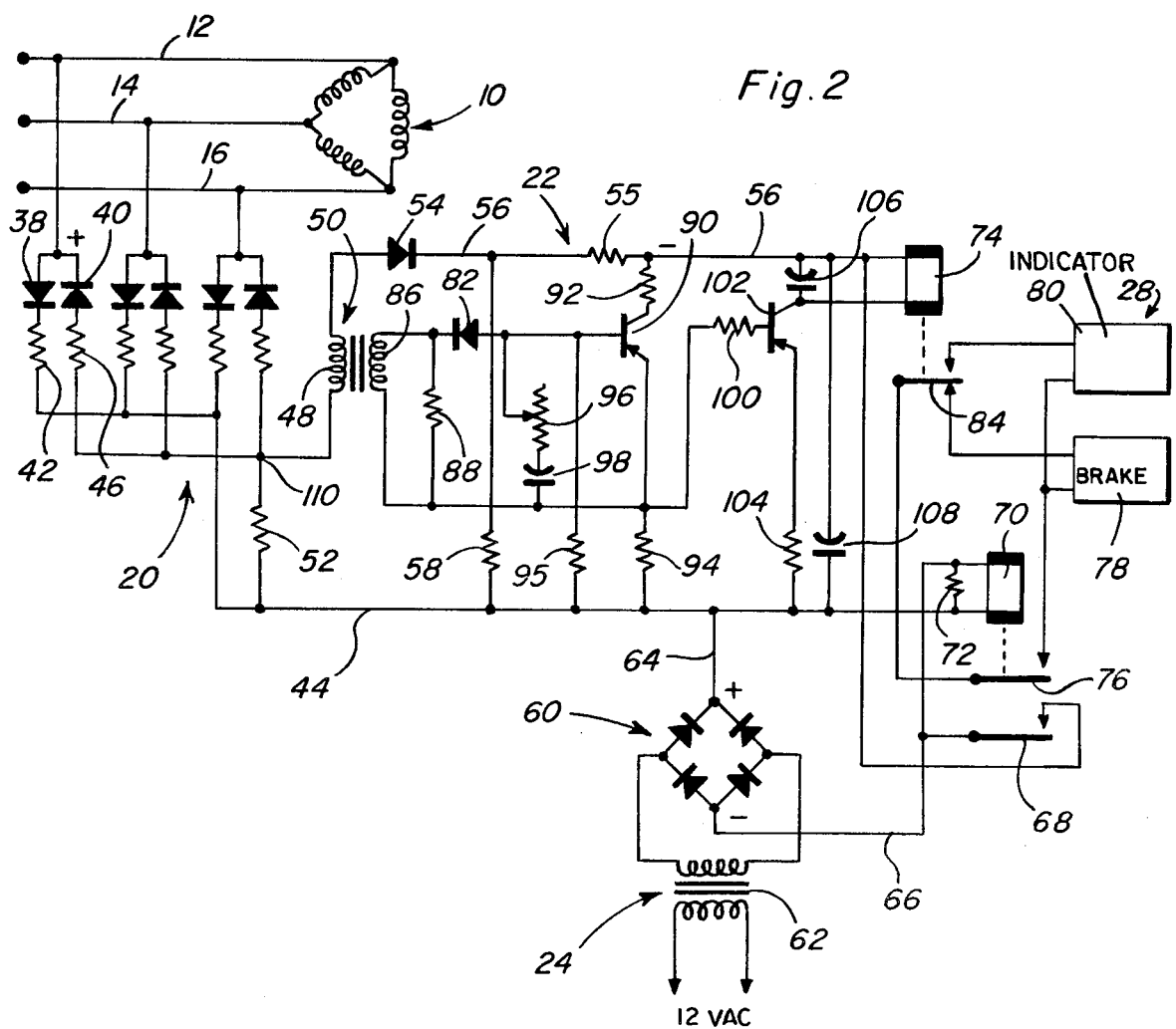
FIG. 2 is an electrical circuit diagram corresponding to the system depicted in FIG. 1.

FIG. 2 illustrates the system circuitry including the direct electrical connection of each power phase line 12, 14 and 16 to a pair of diodes 38 and 40 poled in the opposite directions. The diodes 38 of each pair are connected in parallel through current limiting resistors 42 to a positive voltage line 44 while the other diodes 40 of each pair are connected by current limiting resistors 46 to a combined signal terminal 110 connected to one end of a primary winding 48 of a signal transformer 50. A load resistor 52 is connected across the voltage line 44 and the terminal 110. The other end of primary winding 48 is connected to a blocking diode 54 applying a negative DC voltage to line 56 through voltage divider resistors 55 and 58.

The DC source 24 includes a full wave rectifier 60, the input of which is connected through a power transformer 62 to a low AC voltage source of 12 volts, for example. The positive DC output of the rectifier 60 is directly connected to the signal voltage line 44 while the negative DC output of the rectifier is connected through normally opened relay switch 68 to negative voltage line 56. The DC output terminals of the rectifier 60 are also directly connected across relay coil 70 in the relay section 26 in parallel with load resistor 72. The relay section also includes a second relay coil 74 connected to the output of the detector circuit 22. With the relay coil 70 normally energized by the DC voltage source 24, DC voltage is applied through relay switch 68 to the detector circuit for operation thereof while normally open relay switch 76 is rendered operative to hold a brake device 78 disengaged. The relay coil 74 of the relay section 26 is normally deenergized and in response to an output of the detector circuit 22 actuates its relay switch 84 thereby operating an indicator 80 and at the same time releasing the brake device 78 for engagement in order to prevent damage to the equipment being protected. The brake device 78 and indicator 80 form part of the alarm section 28.

The input to the detector circuit is applied through the signal transformer 50 to a secondary output winding 86. A load resistor 88 is connected across the secondary winding terminals and the signal output thereof is connected by diode 82 to the base-emitter circuit of a signal amplifying transistor 90 having its collector connected in series with load resistor 92 to the voltage line 56. An emitter bias resistor 94 is connected between the emitter and voltage line 44. Base bias is established through a resistor 95 to prevent the transistor from generating a false signal after an input signal ceases. An adjustable resistor 96 is connected in series with capacitor 98 across the base emitter circuit of the transistor 90 which acts as an emitter follower supplying an output signal through coupling resistor 100 to the input base of a signal driving transistor 102 having an emitter connected through emitter resistor 104 to the voltage line 44. The collector output of the transistor 102 is connected to one terminal of the relay coil 74, the other terminal of which is connected to the voltage line 56. A relay chatter capacitor 106 is connected across the terminals of the relay coil 74 while a storage capacitor 108 is connected across voltage lines 56 and 44 in order to remove DC ripple voltage from the output of the detector circuit and to store sufficient energy in order to operate the system for a short interval of time such as three seconds for purposes to be discussed hereinafter.

The 12 volt DC operating voltage supplied by source 24 is isolated from the three phase power supply during normal operation by means of the diode 54 which prevents any negative rectified phase currents from entering the detector circuit. Accordingly, under normal conditions any negative DC current from the rectifier 60 otherwise conducted through the transformer primary 48 is blocked by a higher rectified current supplied from the section 20 to terminal 110 so as to prevent any signal output from the detector circuit. Should there be any phase failure as hereinbefore indicated with respect to the lower portion of FIG. 3, a DC insertion current will flow through the primary winding 48 in series with the load resistor 52 only during the time gap 36 depicted in FIG. 3. This insertion current is injected by the DC voltage source 24 to produce an injection signal of short duration. The injection signal is transmitted by the magnetic coupling of transformer 50 and converted to a negative DC signal by diode 82 before it is applied to the signal input base of transistor 90. The signal is amplified by the transistor 90 and fed by transistor 102 to the relay coil 74 for energization thereof. When energized, the relay coil 74 actuates its relay switch 84 in order to stop the equipment being protected and to operate the alarm indicator 80. By means of adjustable resistor 96, operation of the relay 74 may be adjusted for a time delay between 1 and 180 cycles. The circuit will operate on different power supply frequencies without adjustment.

The storage capacitor 108 aforementioned, insures operation of the detector circuit even though the low DC voltage source 24 is drained during a long time gap 36 between rectified phase current resulting from phase current loss. In the event of failure of the DC voltage source 24, relay coil 70 will be de-energized to thereby open its relay switches 68 and 76 to prevent detector circuit operation and cause engagement of brake device 78 to protect the load 10. The system is automatically reset when power from source 24 is restored by energizing relay coil 70. The system furthermore responds only to loss of at least one of the power phase line currents regardless of the balanced condition or voltage levels of the power phases and does not require any particular sequence of phase line connection.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as new is as follows:

1. A protective system for electrical loads connected in delta or wye configuration by a plurality of power phase lines to an AC polyphase power supply, comprising rectifier means coupled to each of said power phase lines for establishing rectified phase currents that are time spaced in response to failure in at least one of the power phase lines, a source of DC voltage, means connecting said source to the rectifier means for insertion of a signal current only between the rectified phase currents that are time spaced and detector means connected to the rectifier means for sensing said inserted signal current between the phase currents that are time spaced reflecting said failure in at least one of the power phase lines.

2. The system as defined in claim 1 wherein said detector means is operative under different cycle frequencies of the power supply.

3. The system as defined in claim 2 wherein said signal insertion means includes a blocking diode limiting flow of the inserted signal current to a time gap between said time spaced rectified phase currents, the duration of said time gap being an inverse function of the cycle frequency of the power supply.

4. The system as defined in claim 1 wherein said signal insertion means includes a blocking diode limiting flow of the inserted signal current to a time gap between said time spaced rectified phase currents, the duration of said time gap being an inverse function of the cycle frequency of the power supply.

5. The system as defined in claim 4 wherein said detector means includes a sine wave sensing circuit inductively coupled to the rectifier means for amplifying said signal current and relay means connected to the sensing circuit for energization in response to the amplified signal current.

6. The system as defined in claim 5 including capacitor means connected to the relay means for maintaining energization thereof upon drainage of the DC voltage source during the time gap.

7. The system as defined in claim 1 including relay means responsive to failure of said DC voltage source for disabling the detector means.

8. A protective system for electrical loads connected by a plurality of phase lines to an AC polyphase power supply, comprising rectifier means coupled to each of said power phase lines for establishing rectified phase currents in response to failure in at least one of the power phase lines, a source of DC voltage connected to the rectifier means, and current detecting means connected to the rectifier means for indicating failure in at least one of the power phase lines, said rectifier means including oppositely poled rectifying diodes directly connected to each of said power phase lines, a signal terminal connected to the detector means and current limiting resistors connecting said rectifying diodes in parallel to the signal terminal.

9. A protective system for an electrical load connected by a plurality of power phase lines to an AC polyphase power supply, comprising rectifier means coupled to each of said power phase lines for establishing time spaced rectified phase currents in response to failure in at least one of the power phase lines, a source of DC voltage, means connecting said source to the rectifier means for insertion of a signal current between the time spaced rectified phase currents and detector means connected to the rectifier means for sensing said inserted signal current reflecting said failure in at least one of the power phase lines, said rectifier means including oppositely poled rectifying diodes directly connected to each of said power phase lines, a signal terminal connected to the detector means and current limiting resistors connecting said rectifying diodes in parallel to the signal terminal.

10. The system as defined in claim 9 wherein said detector means includes a sine wave sensing circuit inductively coupled to the rectifier means for amplifying said signal current and relay means connected to the sensing circuit for energization in response to the amplified signal current.

11. The system as defined in claim 10 including relay means responsive to failure of said DC voltage source for disabling the detector means.

* * * * *